United States Patent
Amer et al.

(10) Patent No.: US 10,452,554 B2
(45) Date of Patent: Oct. 22, 2019

(54) ADAPTIVE RESIZABLE CACHE/LCM FOR IMPROVED POWER

(71) Applicants: Advanced Micro Devices, Inc., Sunnyvale, CA (US); ATI Technologies ULC, Markham (CA)

(72) Inventors: Ihab Amer, Markham (CA); Khaled Mammou, Vancouver (CA); Haibo Liu, Markham (CA); Edward Harold, Markham (CA); Fabio Gulino, Markham (CA); Samuel Naffziger, Fort Collins, CO (US); Gabor Sines, Markham (CA); Lawrence A. Bair, Boxborough, MA (US); Andy Sung, Markham (CA); Lei Zhang, Markham (CA)

(73) Assignees: ADVANCED MICRO DEVICES, INC., Sunnyvale, CA (US); ATI TECHNOLOGIES ULC, Markham, Ontario (CA)

(*) Notice: Subject to any disclaimer, the term of this patent is extended or adjusted under 35 U.S.C. 154(b) by 223 days.

(21) Appl. No.: 15/094,391

(22) Filed: Apr. 8, 2016

(65) Prior Publication Data

US 2017/0293564 A1    Oct. 12, 2017

(51) Int. Cl.
*G06F 12/08* (2016.01)
*G11C 11/417* (2006.01)
(Continued)

(52) U.S. Cl.
CPC ...... *G06F 12/0877* (2013.01); *G06F 12/0893* (2013.01); *G11C 11/417* (2013.01);
(Continued)

(58) Field of Classification Search
CPC .............. G11C 11/417; G06F 12/0893; G06F 12/0877
(Continued)

(56) References Cited

U.S. PATENT DOCUMENTS

| 7,552,282 B1 * | 6/2009 | Bermingham | G06F 12/0802 711/118 |
| 8,713,261 B1 * | 4/2014 | Aharoni | G06F 12/0868 711/137 |

(Continued)

OTHER PUBLICATIONS

Flautner et al., Drowsy Caches: Simple Techniques for Reducing Leakage Power, 2002, IEEE Computer Society, 1063-6897/02 Proceedings of the 29th Annual International Symposium on Computer Architecture (ISCA02) (Year: 2002).*

*Primary Examiner* — Tuan V Thai
*Assistant Examiner* — Edward Waddy, Jr.
(74) *Attorney, Agent, or Firm* — Volpe and Koenig, P.C.

(57) ABSTRACT

Systems, apparatuses and methods of adaptively controlling a cache operating voltage are provided that comprise receiving indications of a plurality of cache usage amounts. Each cache usage amount corresponds to an amount of data to be accessed in a cache by one of a plurality of portions of a data processing application. The plurality of cache usage amounts are determining based on the received indications of the plurality of cache usage amounts. A voltage level applied to the cache is adaptively controlled based on one or more of the plurality of determined cache usage amounts. Memory access to the cache is controlled to be directed to a non-failing portion of the cache at the applied voltage level.

20 Claims, 5 Drawing Sheets

(51) Int. Cl.
*G06F 12/0877* (2016.01)
*G06F 12/0893* (2016.01)
*G11C 5/14* (2006.01)

(52) U.S. Cl.
CPC ............... *G06F 2212/1028* (2013.01); *G06F 2212/221* (2013.01); *G06F 2212/60* (2013.01); *G11C 5/148* (2013.01)

(58) Field of Classification Search
USPC .................. 711/102, 118, 154, 170, 113
See application file for complete search history.

(56) References Cited

U.S. PATENT DOCUMENTS

| | | | |
|---|---|---|---|
| 2002/0004917 A1* | 1/2002 | Malcolm | G06F 11/1435 714/4.1 |
| 2012/0159074 A1* | 6/2012 | Sodhi | G06F 12/0895 711/122 |
| 2017/0017576 A1* | 1/2017 | Cammarota | G06N 20/00 |

* cited by examiner

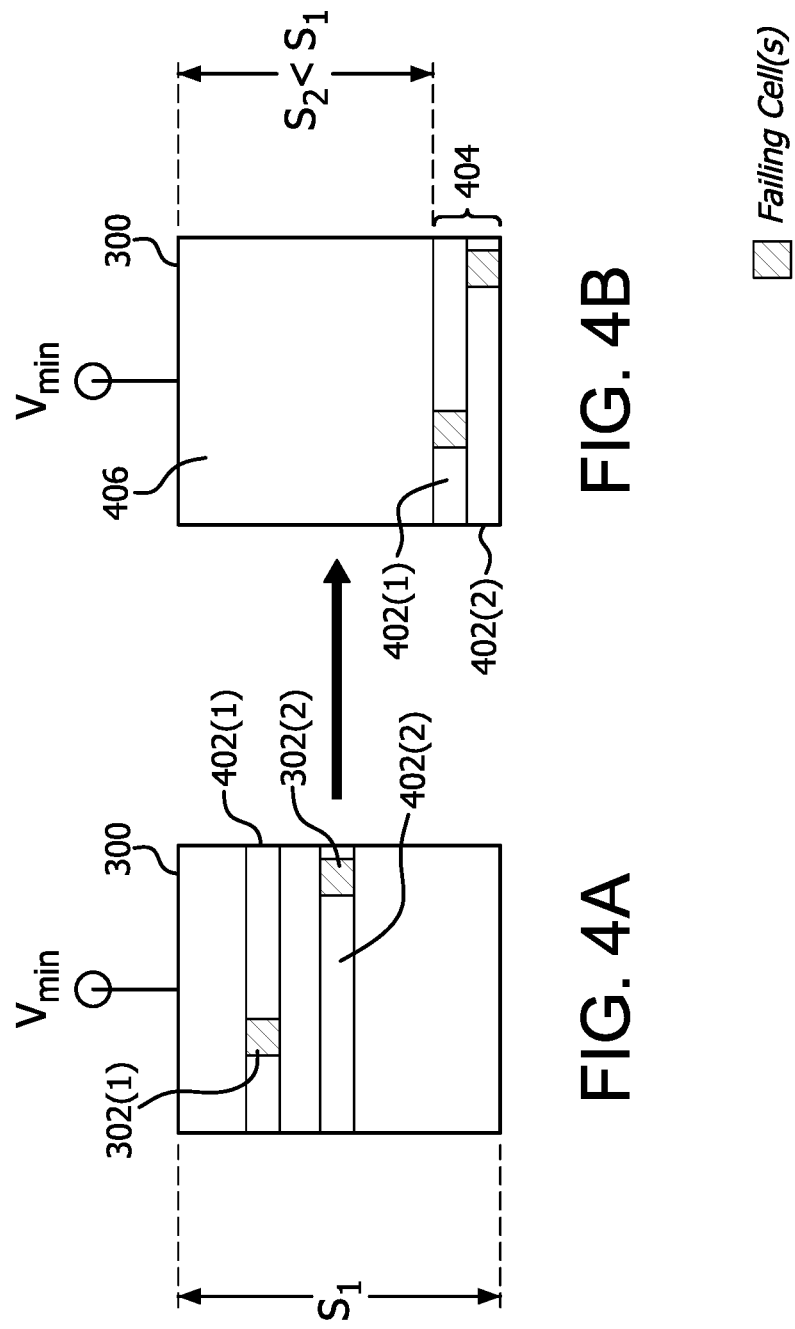

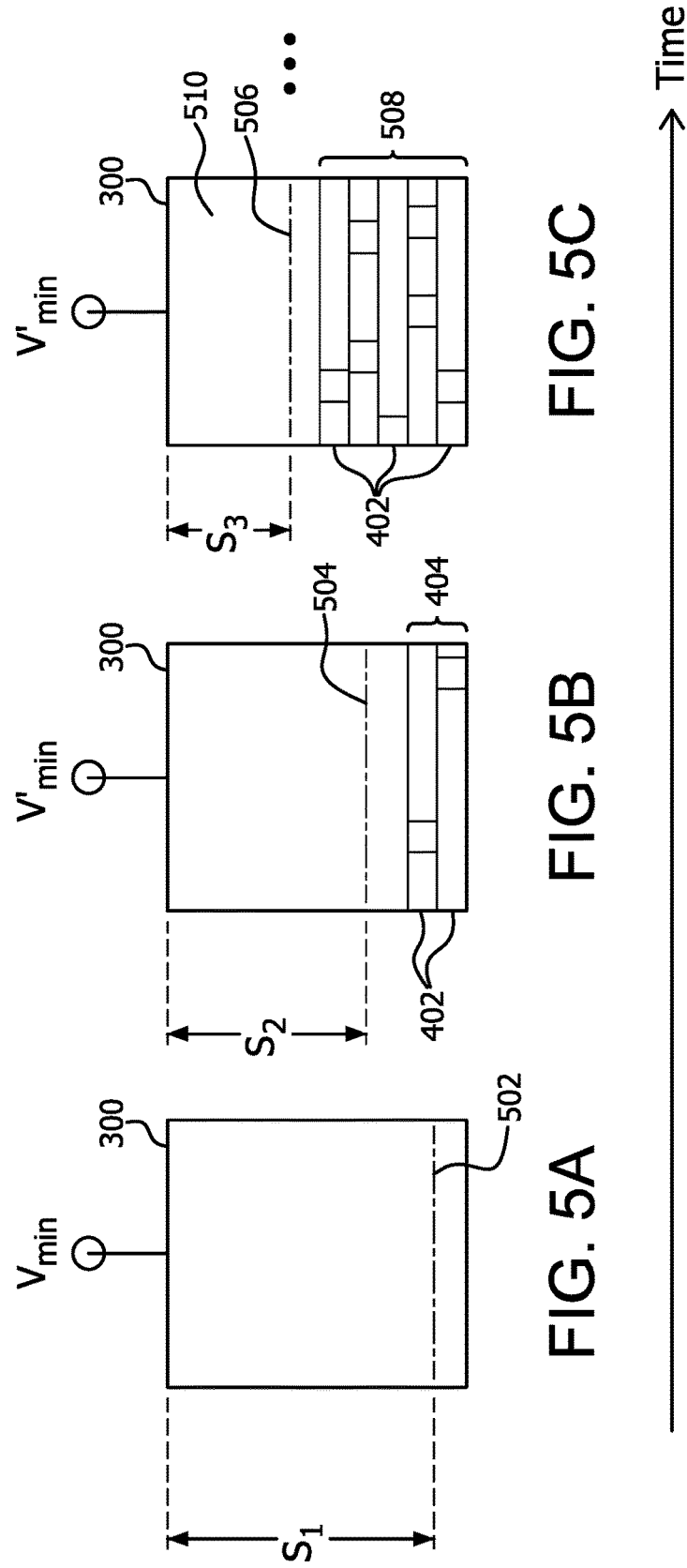

ADAPTIVE RESIZABLE CACHE/LCM FOR IMPROVED POWER

TECHNICAL FIELD

The disclosed embodiments are generally directed to systems, apparatuses and methods controlling a driving voltage applied to a cache, and in particular, to systems, apparatuses and methods of adaptively controlling a driving voltage applied to a cache based on cache usage amounts by portions of a data processing application while maintaining cache reliability at the applied voltage level.

BACKGROUND

System on-chip (SOC) circuitry includes static random access memory SRAM (e.g., used for cache memory). SRAM arrays (e.g., a cache) are configured such that the memory cells in the array maintain their state (logic 1 or logic 0) as long as power is supplied to the SRAM. SRAM arrays, such as a cache, operate at a minimum driving voltage ($V_{min}$) to maintain the states of their memory cells and provide reliable results for operations (e.g., read operation, write operation).

Due to process variation, a single cell array typically includes several cells having a different Static Noise Margin (SNM). The SNM corresponds to the lowest driving voltage applied to a memory cell (due to the maximum amount of noise that may be accepted) in which the memory cell state may be preserved reliably. Accordingly, if the driving voltage of a cache falls below $V_{min}$, defined as per the SNM of the least reliable cell(s) in the supported cache, the state of cells in the cache may not be maintained and the data (e.g., logic 1 or logic 0) in the cells may be lost (e.g., logic 1 may change to logic 0). Typically, the lowest driving voltage of the cache (Vmin) may be derived based on a low population of cells that have low SNM. For a conventional single-rail SRAM (single voltage applied to the SRAM), $V_{min}$ is applied across the logic on the voltage rail to maintain the state of the SRAM cells, significantly impacting the overall system's power consumption.

BRIEF DESCRIPTION OF THE DRAWINGS

A more detailed understanding may be had from the following description, given by way of example in conjunction with the accompanying drawings wherein:

FIG. 4A and FIG. 4B are illustrations showing resizing and remapping of an exemplary cache memory operating at an applied voltage; and FIG. 5A to FIG. 5C are illustrations showing the resizing and remapping of an exemplary cache memory over time based on different cache usages.

DETAILED DESCRIPTION

Figure 1:
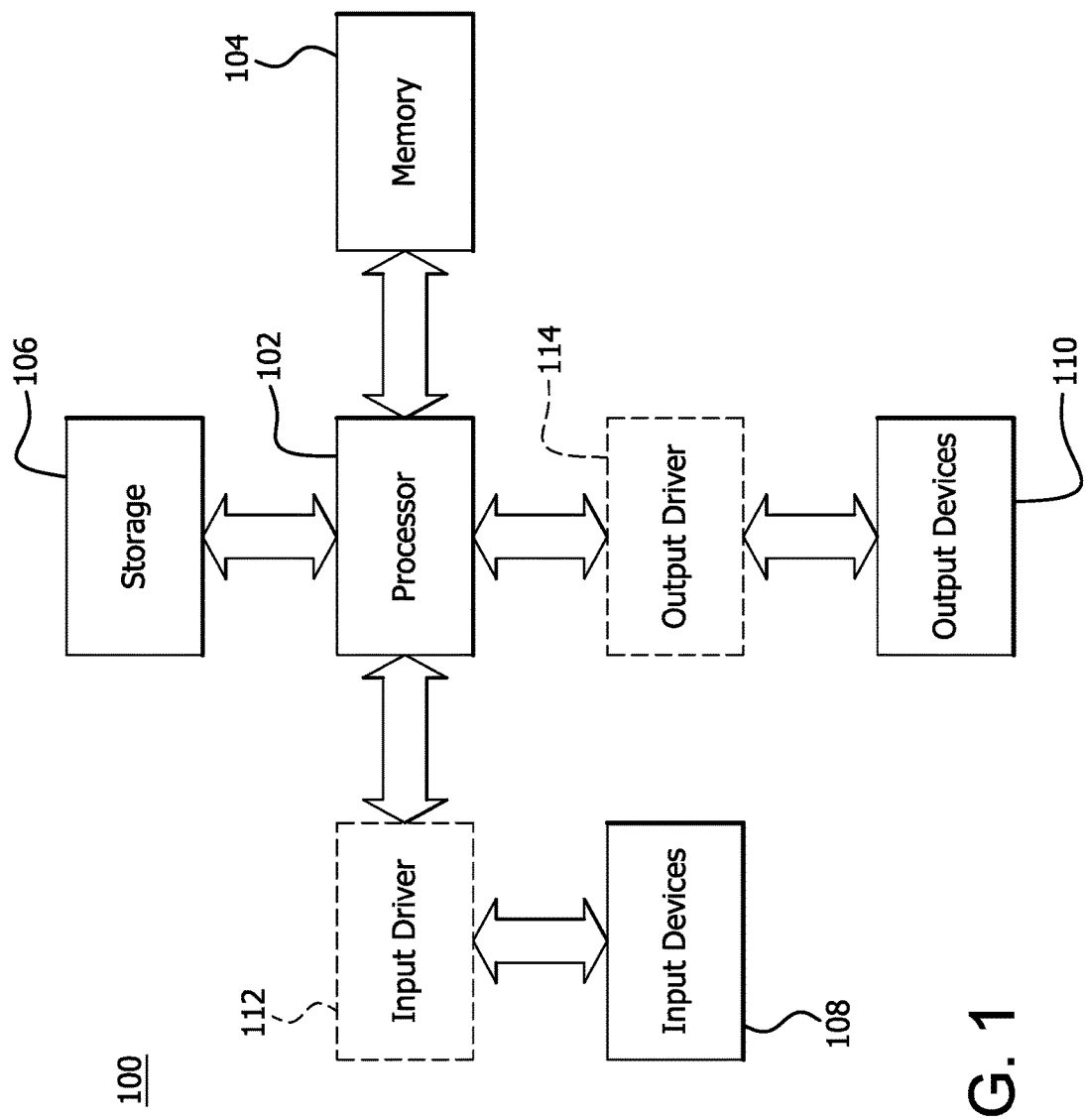
FIG. 1 is a block diagram of an example device in which systems, apparatuses, and methods disclosed herein may be implemented.

A method of adaptively controlling a cache operating voltage is provided that comprises receiving indications of a plurality of cache usage amounts, each cache usage amount corresponding to an amount of data to be accessed in a cache by one of a plurality of portions of a data processing application, determining the plurality of cache usage amounts based on the received indications of the plurality of cache usage amounts, adaptively controlling a voltage level applied to the cache based on one or more of the plurality of determined cache usage amounts; and controlling memory access to the cache to be directed to a non-failing portion of the cache at the applied voltage level.

Controlling the voltage applied to cache may further comprise adaptively varying the voltage between a first voltage level and a second voltage level based on one of the determined plurality of cache usage amounts.

The first voltage level may be a minimum driving voltage ($V_{min}$) level that maintain states of each of a plurality of memory cells in the cache and the second voltage level may be a voltage level less than the $V_{min}$ level which causes one or more failing portions of the cache each including one or more of the plurality of memory cells having corresponding states that are not maintained when the second voltage level is applied.

Controlling the voltage applied to cache may further comprise varying the voltage between the first voltage level, the second voltage level and a third voltage level, the third voltage level causing one or more additional failing portions of the cache each including additional one or more memory cells having corresponding states that are not maintained when the third voltage level is applied.

The first voltage level may be applied to the cache based on a first determined cache usage amount identifying a first amount of data to be accessed in a cache by a first portion of the data processing application and the second voltage level may be applied to the cache based on a second determined cache usage amount corresponding to second amount of data to be accessed in the cache by a second portion of the data processing application. The second determined cache usage amount is less than the first determined cache usage amount.

The indications of the plurality of cache usage amounts may comprise metadata in the portion of the application to be executed.

The indications of the plurality of cache usage amounts may comprise an instruction to reduce the size of the cache.

The method may further comprise determining the non-failing portion of the cache at the applied voltage level by remapping one or more identified failing cells in the cache to one or more non-failing cells in the non-failing portion of the cache. Controlling memory access to the cache may further comprise directing the memory access to the one or more non-failing cells in the cache at the applied voltage level.

The method may further comprise determining a largest contiguous region of one or more non-failing portions of the cache at the applied voltage level; and controlling memory access to the cache to be directed to the largest contiguous region of one or more non-failing portions of the cache at the applied voltage level.

A processor device is provided that comprises a cache that includes a plurality of static random access memory (SRAM) cells each configured to hold a value (e.g., logic 1 and logic 0) when a voltage is applied and one or more processors. The one or more processors are configured to receive indications of a plurality of cache usage amounts, each cache usage amount corresponding to an amount of data to be accessed in a cache by one of a plurality of portions of a data processing application, determine the plurality of cache usage amounts based on the received indications of the plurality of cache usage amounts, adaptively a voltage level applied to the cache based on one or more of the plurality of determined cache usage amounts and control memory access to the cache to be directed to a non-failing portion of the cache at the applied voltage level.

The one or more processors are further configured to control the voltage applied to cache by adaptively varying the voltage between a first voltage level and a second voltage level based on one of the determined plurality of cache usage amounts.

The first voltage level may be a minimum driving voltage ($V_{min}$) level that maintain states of each of a plurality of memory cells in the cache and the second voltage level may be a voltage level less than the $V_{min}$ level which causes one or more failing portions of the cache each including one or more of the plurality of memory cells having corresponding states that are not maintained when the second voltage level is applied.

The one or more processors may be further configured to control the voltage applied to cache by varying the voltage between the first voltage level, the second voltage level and a third voltage level, the third voltage level causing one or more additional failing portions of the cache each including additional one or more memory cells having corresponding states that are not maintained when the third voltage level is applied.

The first voltage level may be applied to the cache based on a first determined cache usage amount identifying a first amount of data to be accessed in a cache by a first portion of the data processing application and the second voltage level is applied to the cache based on a second determined cache usage amount corresponding to second amount of data to be accessed in the cache by a second portion of the data processing application and the second determined cache usage amount is less than the first determined cache usage amount.

The indications of the plurality of cache usage amounts may comprise metadata in the portion of the application to be executed.

The indications of the plurality of cache usage amounts may comprise an instruction to reduce the size of the cache.

The one or more processors may be further configured to determine the non-failing portion of the cache at the applied voltage level by remapping one or more identified failing cells in the cache to one or more non-failing cells in the non-failing portion of the cache and control memory access to the cache by directing the memory access to the one or more non-failing cells in the cache at the applied voltage level.

The one or more processors may be further configured to determine a largest contiguous region of one or more non-failing portions of the cache at the applied voltage level and control memory access to the cache to be directed to the largest contiguous region of one or more non-failing portions of the cache at the applied voltage level.

A non-transitory computer readable medium is provided that comprises instructions for causing a computer to execute a method of adaptively controlling a cache operating voltage. The instructions comprise receiving indications of a plurality of cache usage amounts, each cache usage amount corresponding to an amount of data to be accessed in a cache by one of a plurality of portions of a data processing application, determining the plurality of cache usage amounts based on the received indications of the plurality of cache usage amounts, adaptively controlling a voltage level applied to the cache based on one or more of the plurality of determined cache usage amounts and controlling memory access to the cache to be directed to a non-failing portion of the cache at the applied voltage level.

The instruction of controlling the voltage applied to cache may further comprise adaptively varying the voltage between a first voltage level and a second voltage level based on one of the determined plurality of cache usage amounts.

$V_{min}$ of an intellectual property (IP) core (e.g., block of logic or data) may be defined as the driving voltage that maintains reliable operation for the maximum supported cache size. For some data processing applications (e.g., multimedia applications), the cache usage may vary over time. Regardless of the cache usage amount, however, the IP core is not driven below $V_{min}$ because the maximum supported cache size is made available to the IP core. For example, a first portion of an application may use less of the maximum supported cache size (e.g., less than the maximum amount of data that can be stored in the cache) than a second portion of an application. The first portion of the application may, for example, include low-resolution decoding of video data which operates on a low clock frequency to meet a target frame rate. The second portion of the application may, for example, include high-resolution decoding of video data of an application, which operates on a higher clock frequency, and also uses more cache to perform the decoding. Because the maximum supported cache size remains available regardless of the cache used for a specific application, however, the voltage applied across the cache memory array is maintained at $V_{min}$.

The present application provides systems, apparatuses and methods that exploit varied amounts of cache usage each identifying an amount of data to be accessed (e.g., reads, writes, loads stores) in a cache over time by a portion of a data processing application to provide more efficient and reliable systems, apparatuses and methods of adaptively controlling cache driving voltage levels. As the identified cache memory usage of a particular portion of an application decreases, the driving voltage level of the cache may also be decreased, thereby reducing power consumption. For example, a driving voltage level may be adaptively decreased to a sub-$V_{min}$ level of a cache.

The present application discloses systems, apparatuses and methods of adaptively varying a driving voltage level of a cache while maintaining cache reliability. Cache reliability may be maintained by controlling memory access to be directed to a non-failing portion of the cache at the applied voltage level. Non-failing portions may be determined directly (e.g., determining largest contiguous region of one or more non-failing portions). Non-failing portions may also be determined indirectly by determining failing portions of the cache. For example, failing cells may be identified at different driving voltage levels and the determined failing cells may be remapped to non-failing cell regions. Failing cell regions (e.g., column or row of cells that include one or more failing cells) may also be determined from the identified failing cells. Accordingly, access to the cache may be directed to a non-failing portion of the cache by limiting one or more failing cells of a cache from being used to access the data at the applied voltage level. Non-failing portions may be determined off-line (e.g., before a portion of an application is executed) as well as on-line (e.g., during execution (run-time) of a portion of an application).

FIG. 1 is a block diagram of an example device 100 which may be used with systems, apparatuses, and methods disclosed herein. The device 100 may include, for example, a computer, a gaming device, a handheld device, a set-top box, a television, a mobile phone, or a tablet computer. The device 100 includes a processor 102, a memory 104, a storage 106, one or more input devices 108, and one or more output devices 110. The device 100 may also optionally include an input driver 112 and an output driver 114. It is understood that the device 100 may include additional components not shown in FIG. 1.

The processor 102 may include a central processing unit (CPU), a graphics processing unit (GPU), a CPU and GPU located on the same die, or one or more processor cores, wherein each processor core may be a CPU or a GPU. The memory 104 may be located on the same die as the processor 102, or may be located separately from the processor 102. The memory 104 may include a volatile or non-volatile memory, for example, random access memory (RAM), dynamic RAM, or a cache, which may include SRAM.

The storage 106 may include a fixed or removable storage, for example, a hard disk drive, a solid state drive, an optical disk, or a flash drive. The input devices 108 may include a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 may include a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional components, and that the device 100 will operate in the same manner if the input driver 112 and the output driver 114 are not present.

One or more components, such as processor 102 and caches described herein may be components of an apparatus, such as an IP core on a chip. The components may be part of a system on chip (SOC) used in an integrated circuit (e.g., application-specific chip) included in device 100.

Figure 2:
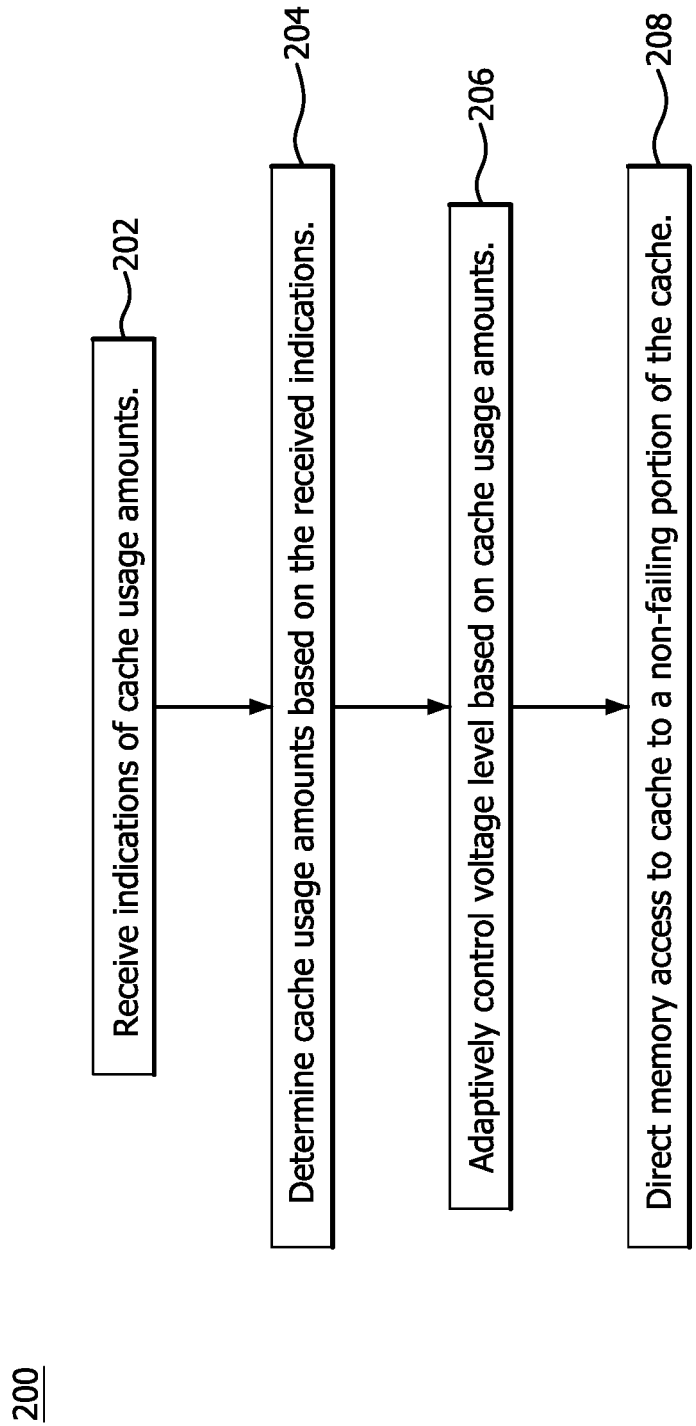
FIG. 2 is a flow diagram illustrating an exemplary method of adaptively controlling a driving voltage applied to a cache.

FIG. 2 is a flow diagram illustrating an exemplary method of adaptively controlling a driving voltage applied to a cache. As shown at block 202 in FIG. 2, the method 200 may include receiving indications of a plurality of cache usage amounts, each cache usage amount corresponding to an amount of data to be accessed in a cache by one of a plurality of portions of a data processing application Information indicating a cache usage amount may include video resolution or definition information. For example, a portion of an application that includes encoding of video data to be displayed may include information indicating the video data is high resolution video data. This information indicates a large amount of cache is to be used to encode the video data. If the video data to be displayed includes information indicating the video data is low resolution video data, the information indicates a small amount of cache is to be used to encode the video data.

Information indicating a cache usage amount may include metadata received from the portion of the application to be accessed. For example, metadata may indicate motion searching parameters (e.g., a large amount of motion searching is to be performed to encode a portion of a video stream) which indicates the amount of cache to be used to encode the portion of the video stream. The metadata may include bitstream header information.

Information indicating a cache usage amount may also include metadata received from a preceding IP core component. For example, metadata related to motion analysis performed (e.g., by GPU, CPU), prior to encoding may be received. The motion analysis metadata may indicate a large amount of motion searching is to be performed to encode a portion of a video stream which indicates a large amount of cache to be used to encode the portion of the video stream.

Information indicating a cache usage amount may also include metadata passed from sender to receiver. For example, the processor 102 may receive information (e.g., map of static regions or skipped regions of a portion of a video stream) from an encoder (not shown), such as an instruction from the encoder to reduce the size of the cache, trading quality and/or compression efficiency for power efficiency.

Information indicating a cache usage amount may also include statistics collected during processing of the portion of application to be executed. For example, an encoder may perform a first pass of encoding a low resolution version to assess how dynamic the portion of the video stream may be and a second pass which uses the information from the first pass to determine the cache usage amount for a portion of application to be executed. The encoder may also determine to use a smaller cache size, impacting quality and compression efficiency, while saving power. For example, if the encoder receives a signal to operate in a "low-power mode," the encoder may make an assumption that the cache size is small, which may be regardless of the video content being processed.

Different portions of an application may use different amounts of cache memory. Each portion of an application may include a portion of data to be accessed using the cache (e.g., writing data to cache, reading data from cache).

As shown at block 204 in FIG. 2, the method 200 may include determining the plurality of cache usage amounts based on the received indications of the plurality of cache usage amounts. For example, one or more processors, such as processor 102, may use the indications to determine corresponding cache usage amounts. Cache usage amounts of each portion of the video stream may be identified from data (e.g., data indicating a usage amount) within the portion of an application. Cache usage amounts may include any cache metric, such as a percentage of the cache to be used (e.g., percentage of maximum supported cache), a number of cells in the cache, a number of binary digits (e.g., number of bits, number of bytes) to be stored in the cache. Cache usage amounts may be determined based on stored information (e.g., in look up table) which includes cache usage amounts corresponding to the indicated information. Cache usage amounts may be determined based on previous information indicating the same or similar cache usage amounts of previous portions of an application. An indication may also directly indicate a cache usage amount for a corresponding portion of an application.

As shown at block 206 in FIG. 2, the method 200 may include adaptively controlling a voltage level applied to the cache based on one or more of the plurality of determined cache usage amounts. The voltage level may be controlled by the processor 102. Controlling the voltage level may include increasing the voltage level, decreasing the voltage level or maintaining the same voltage level. The voltage may be controlled directly or indirectly (e.g., controlling a resistance, a current or a power supply).

Figure 3C:
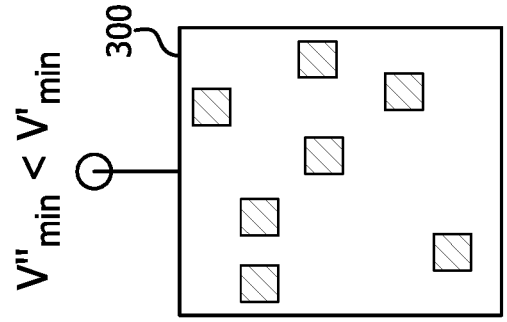
FIG. 3A to FIG. 3C are illustrations showing the effect of sub minimum driving voltages on SRAM cells of an exemplary cache memory.
Figure 3B:
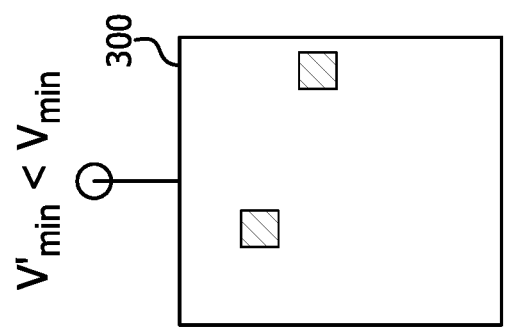
Figure 3A:
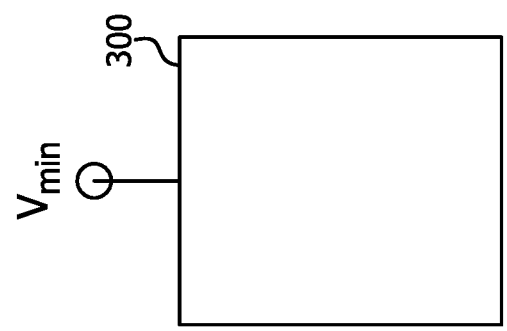

FIGS. 3A to 3C are illustrations showing the effect of sub-minimum driving voltages ($V'_{min}$ and $V''_{min}$) on SRAM memory cells of an exemplary cache memory 300. FIG. 3A shows cache 300 operating at $V_{min}$. FIG. 3B shows cache 300 operating at a first sub $V_{min}$ voltage ($V'_{min}$), which is a driving voltage less than $V_{min}$. FIG. 3C shows cache 300 operating at a second sub $V_{min}$ voltage ($V''_{min}$), which is a driving voltage less than $V'_{min}$.

A driving voltage level may be any applied voltage level, including $V_{min}$ level for the cache 300 and a sub-$V_{min}$ level applied to the cache. A driving voltage level may be a single applied voltage or may be a voltage level that includes a range of applied voltages.

Each cache, such as cache 300, may include a corresponding $V_{min}$ in which the state of cells in the cache may be maintained. Each cache also includes a corresponding cache error rate for each sub Vmin voltage level. Each cache also includes a corresponding model of power consumption as a function of frequency and process, voltage, and temperature (PVT) variations.

As shown at block 208 in FIG. 2, the method 200 may include controlling memory access to the cache to be directed to a non-failing portion of the cache at the applied voltage level.

Cache reliability may be maintained by controlling memory access to be directed to a non-failing portion of the cache. Non-failing portions may be determined indirectly by determining failing portions of the cache. For example, one or more identified failing cells 302 or failing cell regions 402 in the cache 300 may be remapped to one or more non-failing cells or non-failing cell regions in the cache 300. Failing cells may be identified at different driving voltage levels and the determined failing cells may be remapped to non-failing cell regions. Failing cell regions (e.g., column or row of cells that include one or more failing cells) may also be determined from the identified failing cells. Accordingly, access to the cache may be directed to a non-failing portion of the cache by limiting one or more failing cells of a cache from being used to access the data at the applied voltage level. Non-failing portions may be determined off-line (e.g., before a portion of an application is executed) as well as on-line (e.g., during execution (run-time) of a portion of an application).

The remapping of failing cells 302 or failing cell regions 402 may include storing (or dynamically determining) a map of the failing cells 302 or failing cell regions 402 at a plurality of voltage levels. The remapping may also include storing pointers to non-failing memory cell replacements. For example, the pointer may reference a location of an address of a non-failing cell in the cache as a replacement cell. The remapping may be implemented in software, hardware or a combination of software and hardware.

Non-failing portions may also be determined directly For example, cache reliability may be maintained by determining a largest contiguous region of one or more non-failing portions (e.g., one or more cells, columns, rows) of the cache at an applied voltage level. The memory access to the cache 300 may then be directed to the determined largest contiguous region of one or more non-failing portions of the cache 300 at the applied voltage level. Determining the largest contiguous region of one or more non-failing portions of the memory may use less time and may consume less power than remapping. Determining the largest contiguous region may, however, be less efficient because other smaller non-failing portions may exist in the cache outside of the largest contiguous region, which are not used. Accordingly, the available cache size defined by the largest contiguous region of one or more non-failing portions may be less than the available cache size when remapping is used.

For explanation purposes, cache 300 is described and illustrated herein as including a two-dimensional array of memory cells (e.g., matrix of cell rows and cell columns) each configured to store a value (e.g., logic 1 or logic 0). As shown in FIG. 3A to FIG. 3C, the array of cells in the cache 300 includes failing cells 302. For simplification purposes, non-failing cells are not explicitly indicated.

The failure rate (or error rate) of cells 302 vary between each other (e.g., due to varying cell immunity to noise) at different sub-$V_{min}$ levels. Accordingly, as the sub $V_{min}$ level decreases, cells 302 do not fail simultaneously. That is, one more cells 302 may maintain their corresponding states at a particular voltage level (e.g., sub-$V_{min}$ level) while the corresponding states of one or more other cells 302 fail (e.g., logic 1 changes to logic 0) at the particular voltage level.

For example, as shown in FIG. 3A, when cache 300 operates at $V_{min}$, there are no failing cells. FIG. 3B shows two failing cells 302 when the cache 300 operates at $V'_{min}$. As shown in FIG. 3C, when the cache 300 operates at $V''_{min}$, there are an increased number of failing cells 302. The configuration (e.g., number of rows and columns) and size (e.g., number of cells) of the cache 300 and the number and locations of failing cells 302 shown in FIG. 3 and throughout the application are merely exemplary. Caches may be sized and configured to include any number of rows and columns of cells. The number of and location of failing cells may vary for different caches at different applied voltages.

Failing cells 302 may be identified off-line (e.g., before a portion of an application is executed). For example, memory cells of cache 300 may be tested at boot-up using sequences of instructions where the results of executing the instructions are predetermined (e.g., known from previous execution). The results (e.g., data read from memory cells) of executing the sequences of instructions using the cache 300 at different applied voltage levels may be compared to the predetermined results (e.g., expected results, or correct results) of the sequences of instructions.

For example, off-line identification may include executing (e.g., read data from memory cells in the cache 300) the sequences of instructions using the cache 300 at a first applied voltage level (e.g., $V'_{min}$) and comparing the results (the data read from the memory cells in the cache 300) of the executed sequences of instructions to predetermined data (e.g., expected data, correct data). Cells (e.g., position of cell in cell array) that include data (e.g., value of logic 1 or logic 0) which do not match the predetermined data are identified as failing cells 302 at $V'_{min}$.

Failing cells 302 may be identified for any number of additional voltage levels, in which each level may include a single voltage or a range of voltages. For example, the sequences of instructions using the cache 300 at a second applied voltage level (e.g., $V''_{min}$) may be executed. The results of the executed sequences of instructions at $V''_{min}$ may be compared to predetermined data. Cells that include data which do not match the predetermined data are identified as failing cells at the first applied voltage $V''_{min}$.

Failing cells 302 may also be identified on-line (e.g., during execution (run-time) of a portion of an application). For example, error correction codes may be used to identify failing cells 302 during execution of a portion of an application. When data is written to a cell of the cache 300, additional bits may be added which provides a signature for the data written to the corresponding cell. The signature of the data read from the cell may also be calculated and compared to the stored signature. When the stored signature does not match the calculated signatures, an error is identified for the value read from the corresponding cell, which may then be identified as a failing cell 302.

On-line identification may also include built-in self-testing similar to the off-line testing, which may be performed at each boot-up, at predetermined time intervals, after a predetermined number of boot-ups or upon request to account for temperature, age and other factors that may cause decreased cell reliability.

Both on-line and off-line have limits to their reliability for identify failing cells. For example, error correction coding may provide a reliable identification of failing cells 302 when a small number of errors are identified. The reliability decreases, however, as the number of errors increases. Accordingly, both on-line and off-line identification may be used to provide more accurate identification of failing cells 302.

One or more of the portions of the method described in FIG. 2 may be performed by a processor, such as processor 102. The processor 102 and the cache 300 may be components of an IP core on a chip, such as part of a system on chip (SOC) used in an integrated circuit (e.g., application-specific chip).

As described above, controlling an amount of non-failing cells in the cache to be available for use may include resizing the cache and remapping the cache. FIG. 4A and FIG. 4B are illustrations showing adaptive resizing of exemplary cache 300 and remapping of failing cell regions 402 that include identified failing cells 302 in the cache 300 operating an applied $V_{min}$ voltage level. The adaptive resizing of cache 300 and remapping of failing cell regions 402 may be performed when using on-line identification of failing cells (e.g., using error correction codes) as described above. The identified failing cells 302, may be adaptively remapped and the cache 300 may be adaptively resized during execution each operating voltage level.

The applied voltage ($V_{min}$) shown in FIG. 4A and FIG. 4B is exemplary. Caches may be adaptively resized and remapped at any operating voltage level, such as $V_{min}$ voltage level and sub $V_{min}$ voltage levels. The failing cell regions 402 shown in FIG. 4A and FIG. 4B are also exemplary. Examples of failing cell regions may include any region of one or more identified failing cells of a cache operating at an applied voltage level. A failing cell region may include any shape (e.g., one or more columns of cells, one or more rows of cells, a group of adjacent cells which form a portion of columns and rows), and any size (e.g., number of cells). A failing cell region may also include a single failing cell or multiple failing cells (e.g., multiple contiguous or non-contiguous failing cells in the same row, column multiple adjacent rows). A cache may include any number of failing cell regions (including no failing cell regions) at any location of the cache for a corresponding applied voltage level.

As shown in FIG. 4A, the cache 300 has a size $S_1$ which includes each available memory cell of the cache. Failing cell regions are identified as non-available memory for storing values, which decreases the cache size S. For example, the failing cell regions 402 shown in FIG. 4A include a first failing cell region 402(1) that includes a row of cells including the failing cell 302(1) and a second failing cell region 402(2) that includes a row of cells including the failing cell 302(2).

Caches may be resized at any applied voltage level. For example, as shown in FIG. 4B, the cache 300 may be resized (decreased in size) from size $S_1$ to size $S_2$ which excludes the unavailable failing cell regions 402(1) and 402(2). That is, the size of cache 300 is decreased from size $S_1$ to size $S_2$ because the available cache at the applied $V_{min}$ voltage decreases due to the unavailable failing cell regions 402(1) and 402(2).

Caches may also be remapped at any applied voltage level such that memory access requests to failing cell regions may be redirected to available cell regions. For example, as shown in FIG. 4B, failing cell regions 402(1) and 402(2) may be remapped to unavailable region 404 separate from the available region 406 of the cache 300. Accordingly, memory access requests to failing cell regions 402(1) and 402(2) may be redirected to available cell region 406 defining the new resized cache of size $S_1$.

As shown in FIG. 4A and FIG. 4B, the failing cell regions 402(1) and 402(2) are remapped from their separate column positions in FIG. 4A to the position of contiguous cells in FIG. 4B, identified as unavailable region 404 beginning at a row of the cache 300 indicated by line 408 and ending at the end of the cache 300. The location of the unavailable region 404 shown in FIG. 4B, however, is merely exemplary. Any portion (e.g., cell or region) of the cache having SRAM memory may be accessed (e.g., read from, written to) in substantially the same access time. Accordingly, unavailable regions may include regions of contiguous cells beginning at any row of a cache and ending at any row of a cache. Unavailable regions may also include regions of contiguous cells beginning at any column of a cache and ending at any column of a cache. Unavailable regions may also include any group of adjacent cells that may include columns, rows, and portion of columns or rows.

FIG. 5A to FIG. 5C are illustrations showing the resizing and remapping of an exemplary cache memory 300 over time based on different cache usages (i.e., different use cases). FIG. 5A illustrates a first use case of cache 300 operating at a first applied voltage $V_{min}$ based on an identified first cache usage amount indicated by line 502 during a first time period. FIG. 5B illustrates a second use case of cache 300 operating at a second applied voltage $V'_{min}$ based on an identified second cache usage amount indicated by line 504 during a second time period after the first time period. FIG. 5C illustrates a third use case of cache 300 operating at a third applied voltage $V''_{min}$ based on an identified third cache usage amount indicated by line 506 during a third time period. FIG. 5A to FIG. 5C illustrate use cases in which cache usage decreases over time. Cache usage amounts may, however, increase or decrease from one use case to another over time. Likewise, the applied voltage applied to caches may decrease or increase from one use case to another over time. FIG. 5A to FIG. 5C also illustrate three use cases corresponding to three applied minimum voltages. Any number of use cases may be implemented for a cache operating at any number minimum voltages. Resizing and remapping of cache memories may, however, include any number of different use cases (e.g., corresponding to any number of portions of an application) over time.

Different portions of an application may use different amounts of cache memory. Resizing and remapping of cache memories may be implemented during execution of any portion of an application which uses cache memory. Cache usage amounts of each portion of the video stream may be identified from data (e.g., data indicating a usage amount) within the portion of an application.

For simplification of explanation, an application including video data to be processed (e.g., decoded) is described with reference to FIGS. 5A to 5C. For this example application, cache usage amounts of each portion of the video stream may be identified from data (e.g., data indicating a level of resolution, a motion rate, or other data characteristics indicating an amount of cache usage) within the portion of the video stream (e.g., packet header) to be displayed. Cache usage amounts may also be determined based on received information as described above with regard to block 202 of FIG. 2.

Referring to FIG. 5A, a first portion of the video stream may include high resolution video data to be processed. Accordingly, the first portion of the video stream may be identified as a portion of an application which uses a first cache amount (e.g., a maximum cache available or a large portion of the maximum cache available in cache 300).

For example, as shown in FIG. 5A the first cache amount may include contiguous cell columns between a first memory cell of a cache (illustrated for explanation purposes as the top of the cache 300) to another memory cell 502 in FIG. 5A. Based on this identification of a portion of the video stream which uses the first cache amount, a first voltage level, $V_{min}$, may be applied to the cache 300 to maintain the corresponding states of the cells in the first cache usage amount. As shown in FIG. 5A, there are no failing regions when the cache is operating at the first voltage level $V_{min}$. Accordingly, no resizing or remapping of the cache 300 is performed.

Referring to FIG. 5B, a second portion of the video stream may use a second cache amount less than the first cache amount. For example, the second portion of the video stream may include lower resolution video data to be processed. Accordingly, the second portion of the video stream may be identified as a portion which uses a second cache amount. For example, as shown in FIG. 5B the second cache amount may include cell columns from the top of the cache 300 (e.g., beginning address of the cache 300) to line 504 in FIG. 5B. Based on this identification of the second cache amount, a second voltage $V'_{min}$ level (less than $V_{min}$) may be applied to the cache 300, reducing the power consumption.

As shown in FIG. 5B, at this reduced voltage $V'_{min}$ level, the cache 300 may be resized (decreased in size) from size $S_1$ to size $S_2$ based on the identified second cache amount, which is defined by line 504 (identifying the second cache amount) and which excludes the unavailable failing cell regions 402. Further, as shown in FIG. 5B, the failing cell regions 402 may be remapped to unavailable region 404 separate from the available region 406 of the cache 300. Accordingly, memory access requests to failing cell regions 402 in unavailable region 404 may be redirected to available cell region 406.

Referring to FIG. 5C, a third portion of the video stream may use a third cache amount less than the second cache amount. For example, the third portion of the video stream may include may include even lower resolution video data to be processed. Accordingly, the third portion of the video stream may be identified as a portion which uses a third cache amount. For example, as shown in FIG. 5B the third cache amount may include cell columns from the top of the cache 300 (e.g., beginning address of the cache 300) to line 506 in FIG. 5C.

Based on this identification of the third cache amount, a third voltage $V''_{min}$ (less than $V'_{min}$) may be applied to the cache 300. As shown in FIG. 5C, the cache 300 may be resized (decreased in size) from size $S_2$ to size $S_3$ based on the identified third cache amount, which is defined by line 506 (identifying the third cache amount) and which excludes the increased number of unavailable failing cell regions 402. Further, as shown in FIG. 5C, the failing cell regions 402 may be remapped to unavailable region 508 separate from the available region 510 of the cache 300. Accordingly, memory access requests to failing cell regions 402 in unavailable region 508 may be redirected to available cell region 510.

It should be understood that many variations are possible based on the disclosure herein. Although features and elements are described above in particular combinations, each feature or element may be used alone without the other features and elements or in various combinations with or without other features and elements.

The methods provided may be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors may be manufactured by configuring a manufacturing process using the results of processed hardware description language (HDL) instructions and other intermediary data including netlists (such instructions capable of being stored on a computer readable media). The results of such processing may be maskworks that are then used in a semiconductor manufacturing process to manufacture a processor which implements aspects of the embodiments.

The methods or flow charts provided herein may be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A method of adaptively controlling a cache operating voltage, the method comprising:
   receiving information indicating a plurality of cache usage amounts, each cache usage amount corresponding to an amount of data to be accessed in a cache to execute one of a plurality of portions of a data processing application, each portion being identified by a corresponding cache usage amount;
   determining the plurality of cache usage amounts based on the previously received information indicating the plurality of cache usage amounts for each portion;
   adaptively controlling a voltage level applied to the cache based on one or more of the plurality of determined cache usage amounts; and
   controlling memory access to the cache to be directed to a non-failing portion of the cache at the applied voltage level.

2. The method of claim 1, wherein controlling the voltage applied to cache further comprises adaptively varying the voltage between a first voltage level and a second voltage level.

3. The method of claim 2, wherein the first voltage level is a minimum driving voltage ($V_{min}$) level that maintain states of each of a plurality of memory cells in the cache; and
   the second voltage level is a voltage level less than the $V_{min}$ level which causes one or more failing portions of the cache each including one or more of the plurality of memory cells having corresponding states that are not maintained when the second voltage level is applied.

4. The method of claim 3, wherein controlling the voltage applied to cache further comprises varying the voltage between the first voltage level, the second voltage level and a third voltage level, the third voltage level causing one or more additional failing portions of the cache each including additional one or more memory cells having corresponding states that are not maintained when the third voltage level is applied.

5. The method of claim 3, wherein
the first voltage level is applied to the cache based on a first determined cache usage amount identifying a first amount of data to be accessed in a cache by a first portion of the data processing application and the second voltage level is applied to the cache based on a second determined cache usage amount corresponding to second amount of data to be accessed in the cache by a second portion of the data processing application, and
the second determined cache usage amount is less than the first determined cache usage amount.

6. The method of claim 1, wherein the information indicating the plurality of cache usage amounts comprise metadata in the portion of the application to be executed.

7. The method of claim 1, wherein the information indicating the plurality of cache usage amounts comprise an instruction to reduce the size of the cache.

8. The method of claim 1, further comprising determining the non-failing portion of the cache at the applied voltage level by remapping one or more identified failing cells in the cache to one or more non-failing cells in the non-failing portion of the cache,
wherein controlling memory access to the cache further comprises directing the memory access to the one or more non-failing cells in the cache at the applied voltage level.

9. The method of claim 1, further comprising:
determining a largest contiguous region of one or more non-failing portions of the cache at the applied voltage level; and
controlling memory access to the cache to be directed to the largest contiguous region of one or more non-failing portions of the cache at the applied voltage level.

10. A processor device comprising:
a cache comprising a plurality of memory cells each configured to hold a value when a voltage is applied; and
one or more processors configured to:
receive information indicating a plurality of cache usage amounts, each cache usage amount corresponding to an amount of data to be accessed in a cache to execute one of a plurality of portions of a data processing application, each portion being identified by a corresponding cache usage amount;
determine the plurality of cache usage amounts based on the previously received information indicating the plurality of cache usage amounts for each portion;
adaptively control a voltage level applied to the cache based on one or more of the plurality of determined cache usage amounts; and
control memory access to the cache to be directed to a non-failing portion of the cache at the applied voltage level.

11. The processor device of claim 10, wherein the one or more processors are further configured to control the voltage applied to cache by adaptively varying the voltage between a first voltage level and a second voltage level based on one of the determined plurality of cache usage amounts.

12. The processor device of claim 11, wherein the first voltage level is a minimum driving voltage ($V_{min}$) level that maintain states of each of a plurality of memory cells in the cache; and
the second voltage level is a voltage level less than the $V_{min}$ level which causes one or more failing portions of the cache each including one or more of the plurality of memory cells having corresponding states that are not maintained when the second voltage level is applied.

13. The processor device of claim 12, wherein the one or more processors are further configured to control the voltage applied to cache by varying the voltage between the first voltage level, the second voltage level and a third voltage level, the third voltage level causing one or more additional failing portions of the cache each including additional one or more memory cells having corresponding states that are not maintained when the third voltage level is applied.

14. The processor device of claim 12, wherein
the first voltage level is applied to the cache based on a first determined cache usage amount identifying a first amount of data to be accessed in a cache by a first portion of the data processing application and the second voltage level is applied to the cache based on a second determined cache usage amount corresponding to second amount of data to be accessed in the cache by a second portion of the data processing application, and
the second determined cache usage amount is less than the first determined cache usage amount.

15. The processor device of claim 10, wherein the information indicating the plurality of cache usage amounts comprise metadata in the portion of the application to be executed.

16. The processor device of claim 10, wherein the information indicating the plurality of cache usage amounts comprise an instruction to reduce the size of the cache.

17. The processor device of claim 10, wherein the one or more processors are further configured to:
determine the non-failing portion of the cache at the applied voltage level by remapping one or more identified failing cells in the cache to one or more non-failing cells in the non-failing portion of the cache; and
control memory access to the cache by directing the memory access to the one or more non-failing cells in the cache at the applied voltage level.

18. The processor device of claim 10, wherein the one or more processors are further configured to:
determine a largest contiguous region of one or more non-failing portions of the cache at the applied voltage level; and
control memory access to the cache to be directed to the largest contiguous region of one or more non-failing portions of the cache at the applied voltage level.

19. A non-transitory computer readable medium comprising instructions for causing a computer to execute a method of adaptively controlling a cache operating voltage, the instructions comprising:
receiving information indicating a plurality of cache usage amounts, each cache usage amount corresponding to an amount of data to be accessed in a cache to execute one of a data processing application, each portion being identified by a corresponding cache usage amount;
determining the plurality of cache usage amounts based on the previously received information indicating the plurality of cache usage amounts for each portion;

adaptively controlling a voltage level applied to the cache based on one or more of the plurality of determined cache usage amounts; and controlling memory access to the cache to be directed to a non-failing portion of the cache at the applied voltage level.

20. The non-transitory computer readable medium of claim 19, wherein the instruction of controlling the voltage applied to cache further comprises adaptively varying the voltage between a first voltage level and a second voltage level based on one of the determined plurality of cache usage amounts.

\* \* \* \* \*